United States Patent [19]
Jordan

[11] Patent Number: 5,537,027
[45] Date of Patent: Jul. 16, 1996

[54] CALIBRATION SYSTEM FOR AN ASYMMETRICAL RAMP GENERATOR SYSTEM

[75] Inventor: Edward P. Jordan, Greensboro, N.C.

[73] Assignee: Analog Devices, Inc., Norwood, Mass.

[21] Appl. No.: 428,903

[22] Filed: Apr. 25, 1995

[51] Int. Cl.$^6$ .............................. G01R 1/02; G06F 15/20
[52] U.S. Cl. ........................ 324/130; 364/571.02
[58] Field of Search ................ 324/130, 74; 327/131, 327/133, 134; 364/571.02; 375/22; 332/109

[56] References Cited

U.S. PATENT DOCUMENTS

| | | | |
|---|---|---|---|
| 4,581,585 | 4/1986 | Bristol | 327/134 |
| 5,184,062 | 2/1993 | Ladwig | 324/74 |
| 5,283,515 | 2/1994 | Jordan | 327/134 |
| 5,295,158 | 3/1994 | Jordan | 375/22 |
| 5,347,176 | 9/1994 | Bloom | 327/133 |

*Primary Examiner*—Ernest F. Karlsen
*Attorney, Agent, or Firm*—Iandiorio & Teska

[57] ABSTRACT

A calibration system for an asymmetrical ramp generator system for a pulse width modulator wherein a current splitting circuit establishes a slew rate and a calibration level for the first ramp that is the same as the slew rate and the usable voltage range of the second ramp and wherein the first and second sets of ramps are matched so that calibration of the first set results in simultaneous calibration of the second set.

4 Claims, 6 Drawing Sheets

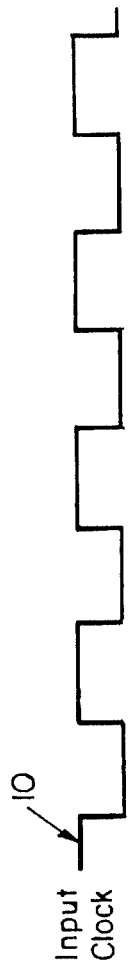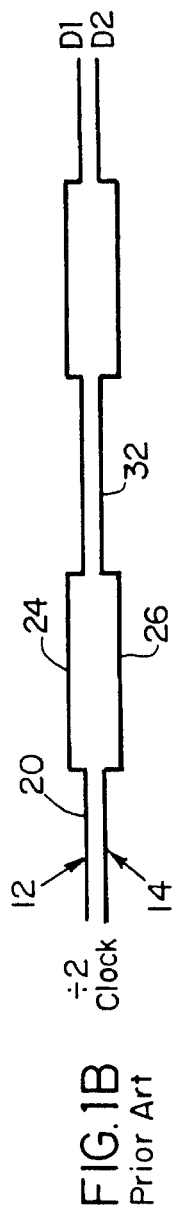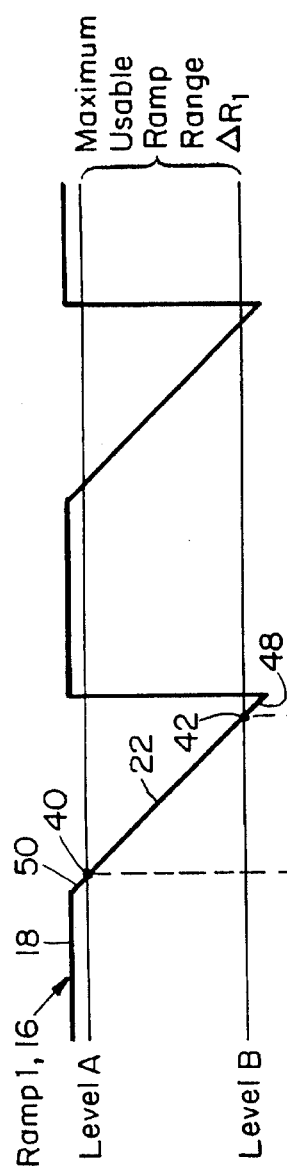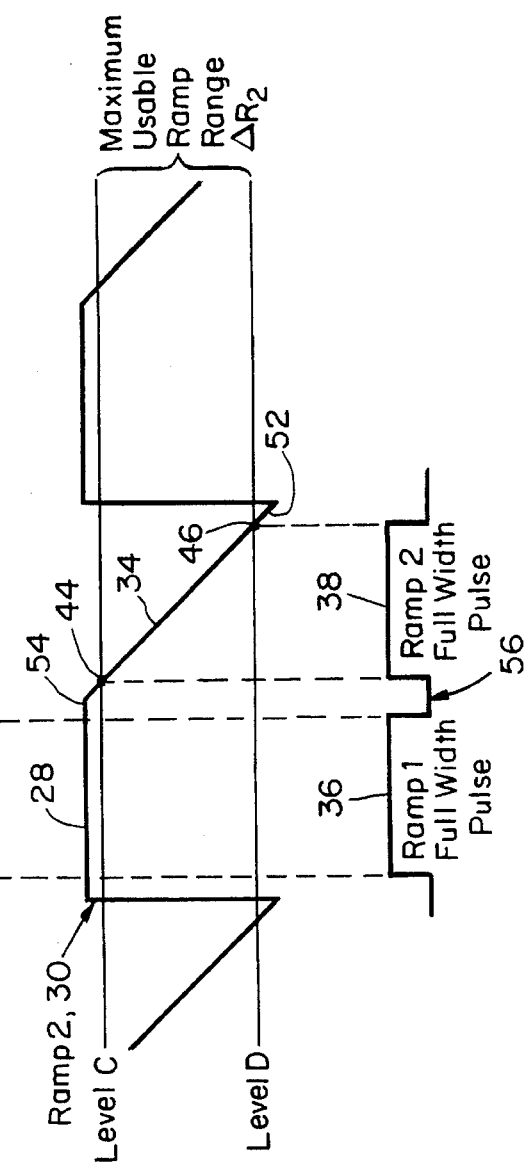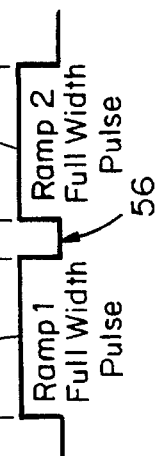
FIG. 1A Prior Art
FIG. 1B Prior Art
FIG. 1C Prior Art
FIG. 1D Prior Art
FIG. 1E Prior Art

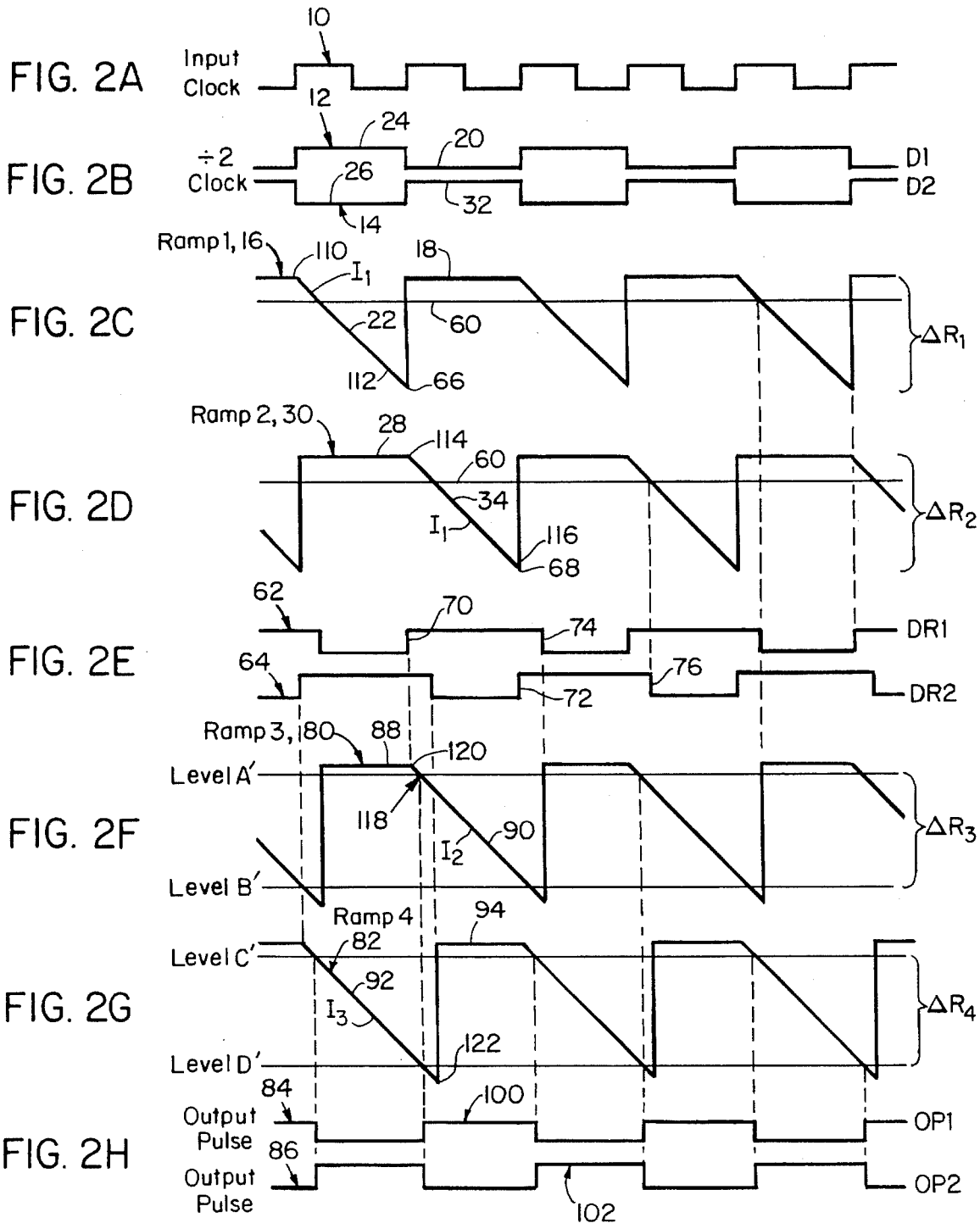

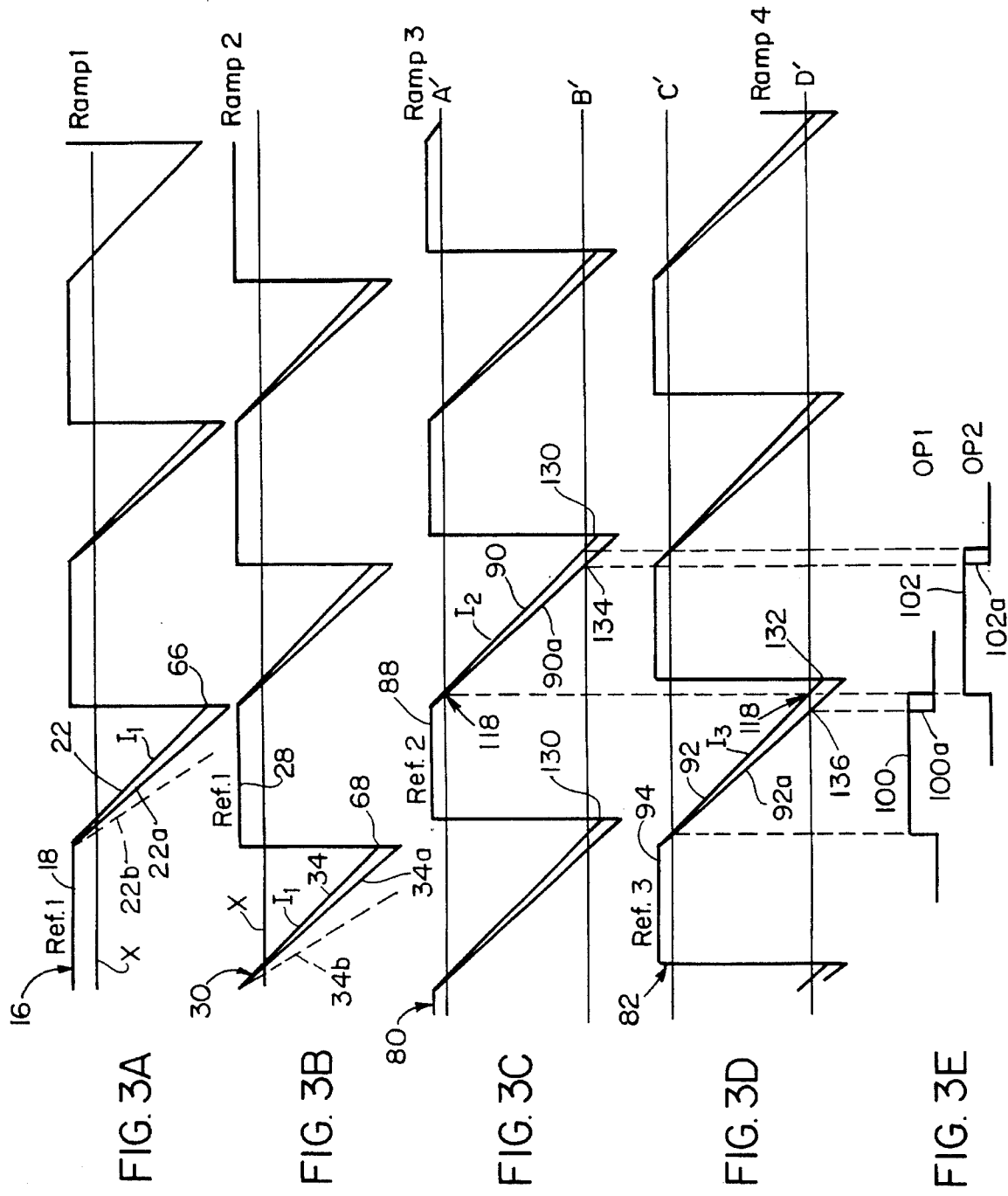

CALIBRATION SYSTEM FOR AN ASYMMETRICAL RAMP GENERATOR SYSTEM

FIELD OF INVENTION

This invention relates to a calibration system for an asymmetrical ramp generator system for a pulse width modulator.

BACKGROUND OF INVENTION

Recent innovations in ramp generators for pulse width modulators employ a first symmetrical dual ramp generator for generating first and second ramps having a predetermined voltage range and extending for a period equal to or greater than one half the clock cycle. The comparator device responds to each of the first and second symmetrical ramps and to a reference level within the predetermined voltage range of the first and second ramps for generating corresponding first and second asymmetrical drive signals. A second symmetrical dual ramp generator responds to the first and second asymmetrical drive signals for generating third and fourth asymmetrical overlapping ramps which extend beyond the predetermined voltage range. The problem of calibration is compounded in such systems because the two sets of ramps have different durations yet they must have identical slopes. Further, when the first set of ramps are calibrated they must be set to swing the same voltage range as the usable range of the second set of ramps.

SUMMARY OF INVENTION

It is therefore an object of this invention to provide an improved calibration system for an asymmetrical ramp generator system for a pulse width modulator.

It is a further object of this invention to provide such an improved asymmetrical ramp generator system which calibrates both sets of ramps simultaneously.

It is a further object of this invention to provide such an improved asymmetrical ramp generator system which calibrates both sets of ramps using the lower limit of the first voltage range.

The invention results from the realization that a truly simple and effective calibration system for an asymmetrical ramp generator system for a pulse width modulator can be achieved by using a current splitting circuit to establish a calibration level for the first ramps that is the same as the usable voltage range of the second ramps, and by insuring that the first and second sets of ramps are matched so that calibration of the first set results in simultaneous calibration of the second set.

This invention features a calibration system for an asymmetrical ramp generator system for a pulse width modulator. There is a complementary clock circuit and a first symmetrical dual ramp generator, responsive to the clock circuit, for generating first and second ramps having a predetermined voltage range and extending for a period equal to or greater than one half the clock cycle. A comparator device, responsive to each of the first and second symmetrical ramps and to a reference level within the predetermined voltage range of the first and second ramps, generates corresponding dual first and second asymmetrical drive signals. A second asymmetrical dual ramp generator, responsive to the first and second asymmetrical drive signals, generates third and fourth asymmetrical overlapping ramps which extend beyond the predetermined voltage range. There is a calibration circuit and a first current splitting circuit, responsive to the calibration circuit, for establishing the reference level at the lower limit of the predetermined voltage ramp. A second current splitting circuit provides slew rate currents to the first and second ramp generators for controlling the slew rate of the first, second, third and fourth ramps. A current stepping device, responsive to the calibration circuit, varies the current to the second current splitting circuit in order to vary the slew rate of the first, second, third and fourth ramps. The calibration circuit includes means, responsive to at least one of the first and second ramps reaching the lower limit for fixing the current provided by the current stepping device to the first and second ramps and simultaneously calibrating the third and fourth ramps and stopping the calibration. The reference level is returned to within the predetermined voltage range after calibration.

In a preferred embodiment the first current splitting circuit may include a first current source matched to a second current source which sets the upper and lower limits of the predetermined voltage range. The first symmetrical dual ramp generator may include first and second ramp generators, a first current source for supplying a first current to set the slew rate of the active one of the first and second ramps and a second current source for supplying a second current to set the upper level of the inactive one of the first and second ramps, and first switching means for alternately, selectively, interchanging the first and second current sources between the first and second ramp generators. The second asymmetrical dual ramp generator may include third and fourth ramp generators, a third current source for supplying a third current to set the slew rate of the third ramp, a fourth current source for supplying a fourth current to set the upper level of the third ramp, a fifth current source for supplying a fifth current to set the slew rate of the fourth ramp, a sixth current to set the upper level of the fourth ramp, and second switching means for alternately, selectively, connecting the third and sixth current sources to one of the third and fourth ramp generators and the fourth and fifth current sources to the other of the third and fourth ramp generators.

DISCLOSURE OF PREFERRED EMBODIMENT

Other objects, features and advantages will occur to those skilled in the art from the following description of a preferred embodiment and the accompanying drawings, in which:

FIGS. 1A–E illustrate the waveforms occurring in a prior art dual ramp generator system for a pulse width modulator.

FIGS. 2A–H illustrate the waveforms occurring in an asymmetrical ramp generator system for a pulse width modulator using a calibration system according to this invention;

FIGS. 3A–E illustrate waveforms depicting ramp overshoot error correction by current sharing between the first and second ramps occurring in an asymmetrical ramp generator system for a pulse width modulator using a calibration system according to this invention;

Figure 4:
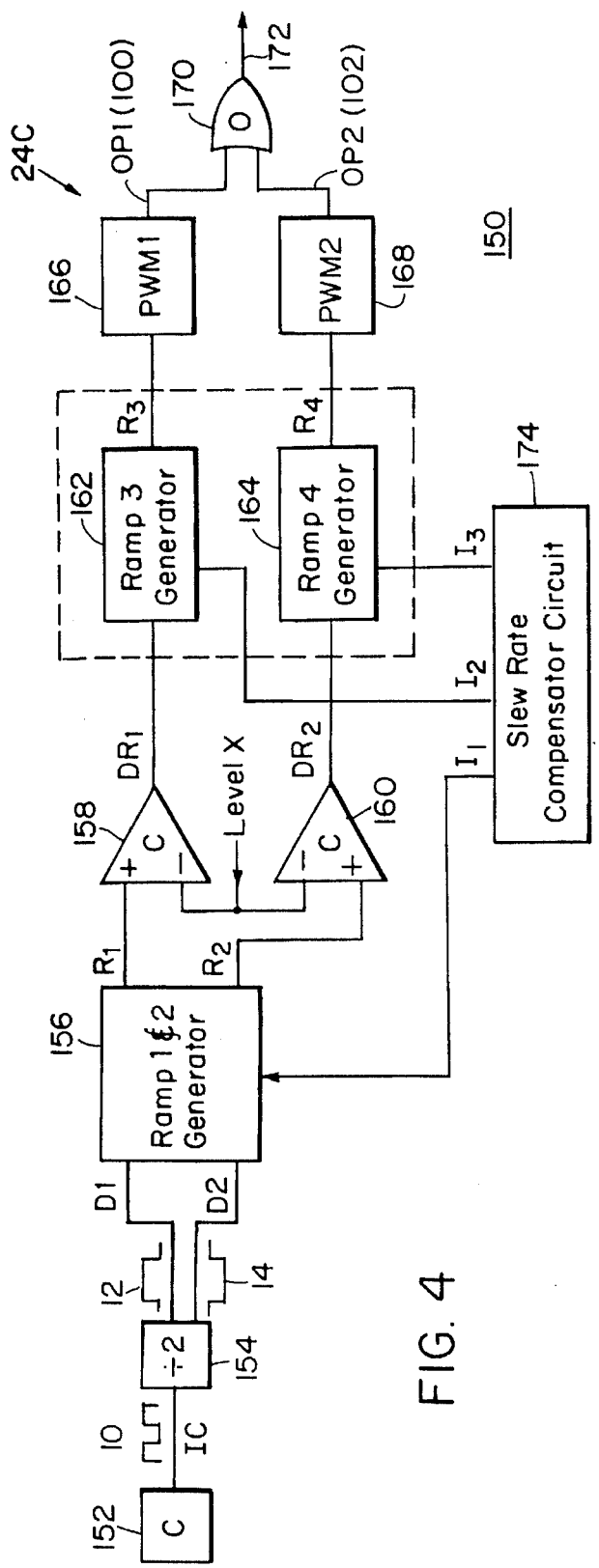
FIG. 4 is a schematic block diagram of an asymmetrical ramp generator system for a pulse width modulator which generates the waveforms of FIGS. 2 and 3.

There is shown in FIG. 1A a typical prior art input clock waveform 10 which when fed through a divide by two circuit provides a pair of drive signals 12, 14 (D1 and D2) which have half the frequency of the input clock 10. The input clock may be 50% duty cycle complementary signal or it may be an asymmetrical signal or it may be a non-complementary signal. In either case the divide by two clock signal 12, 14, (D1 and D2), will, by the nature of the divide by two action, each be a 50% duty cycle complementary clock signal. Clock signal 12 is used to generate ramp 1 16, FIG. 1C. The off time 18 corresponds to the negative portion 20 of clock signal 12 and the on time or ramp portion 22 corresponds to the positive portion 24 of clock signal 12. In a similar fashion, negative portion 26 of clock signal 14 corresponds to the off time portion 28, FIG. 1D, of ramp 2 30 and the positive portion 32 of clock signal 14 corresponds to the on time of ramp portion 34 of ramp 2 30. Levels A and B set the leading edge and trailing edge, respectively, of output pulse 36 in conjunction with on time ramp portion 22. Levels A and B can be provided from any source, for example a DAC, and as shown in FIG. 1C, represent the maximum and minimum levels. They can be varied to any level in between. Levels C and D perform the same function with respect to ramp 30, FIG. 1D, to generate output pulse 38. Note that the typical comparators that are used to detect the crossing points 40 and 42 as well as 44 and 46, cannot respond immediately upon the crossing but require a short period thereafter in which to respond. Thus the ramp portion 22 must extend below level B as shown at 48, and above level A as shown at 50, with respect to ramp 1 16, and ramp portion 34 of ramp 2 30 also has an overshoot portion 52 proximate level D and overshoot portion 54 proximate level C. The maximum usable ramp range ΔR is the distance between level A and B or level C and D when they are at their maximum and minimum points. Since ramps 22 and 34 were generated by contiguous pulses 24 and 32, and since some overlap is required as indicated at 48, 50, 52 and 54, the final output pulses 36 and 38 generated from these ramps will not be contiguous; there will be a gap 56, FIG. 1E, which in some cases may be undesirable.

In the asymmetrical ramp generator system using the calibration system of this invention, input clock 10, FIG. 2A, is used to generate the divide by two clock signals 12 and 14, FIG. 2B. The positive portion 24 and negative portion 20 of clock signal 12 generate the on time ramp portion 22 and the off time 18 of ramp 1 16, and the negative portion 26 and positive portion 32 of clock signal 14 generate the off time 28 and the on time or ramp portion 34 of ramp 2 30, FIG. 2D.

However, a reference level X 60 is used in conjunction with ramp 1 16 and ramp 2 30 to generate intermediate or drive pulses 1 and 2, 62, 64, FIG. 2E. The position of level X 60 determines the position of the falling edges 74 and 76 of drive signals 62 and 64.

Level X can be moved up and down through the maximum usable range ΔR1, ΔR2 of ramps 16 and 30. When level X 60 is at the top of the range coincident with the off time 18 or 28 then the intermediate drive pulses 62 and 64 will be equal. As level X 60 moves downward from the off time 18 and 28 to the low point defined by the lowest extent of slew portions 22 and 34, for example at points 66 and 68, the pulses become larger. Thus when level 60 is at the off time levels 18 and 28, the pulses are contiguous with no gap between them. As level 60 moves downward to points 66 and 68 the pulses become larger and overlap more and more, and when level 60 reaches point 66, 68, the pulses will be 100% greater than the full duty cycle of input clock 10, FIG. 2A.

One advantage of this technique is that even as the pulses are increased from 100% to 200% of the full duty cycle at input clock 10, the leading edge, for example 70, 72, FIG. 2E, remains stationary while the lagging edges 74, 76 are the ones that move out in time. Thus the ramps do not have to be realigned because of an adjustment in the length of the pulses: they always start at the same time and the ramp has the same slope. Drive pulses 62 and 64 are used to generate ramps 3 and 4, 80, 82, FIGS. 2F, 2G, in the same manner as ramps 16 and 30 were generated by divide by two clock, FIGS. 1C and 1D, were provided by divide by two clock signals 12 and 14, FIG. 1B. Now levels A' and B', similar in function to levels A and B, and levels C' and D', similar in function to levels C and D, define the maximum usable ramp range ΔR3 and ΔR4, respectively. They also define the leading and trailing edges of the final output pulses 84, 86, FIG. 2H. Thus merely by moving level X, the relative lengths of the pulses in drive 1 and drive 2 signals 62 and 64 can be adjusted, which in turn adjusts the off time 88 and on time or ramp portion 90 of ramp 3 80, FIG. 2F, and the on time or ramp portion 92 and off time 94 portion of ramp 82, FIG. 2G, and as shown in this specific example, the output pulses 100, 102 can be made to be exactly contiguous without the gap occurring in the prior art devices.

Figure 5:
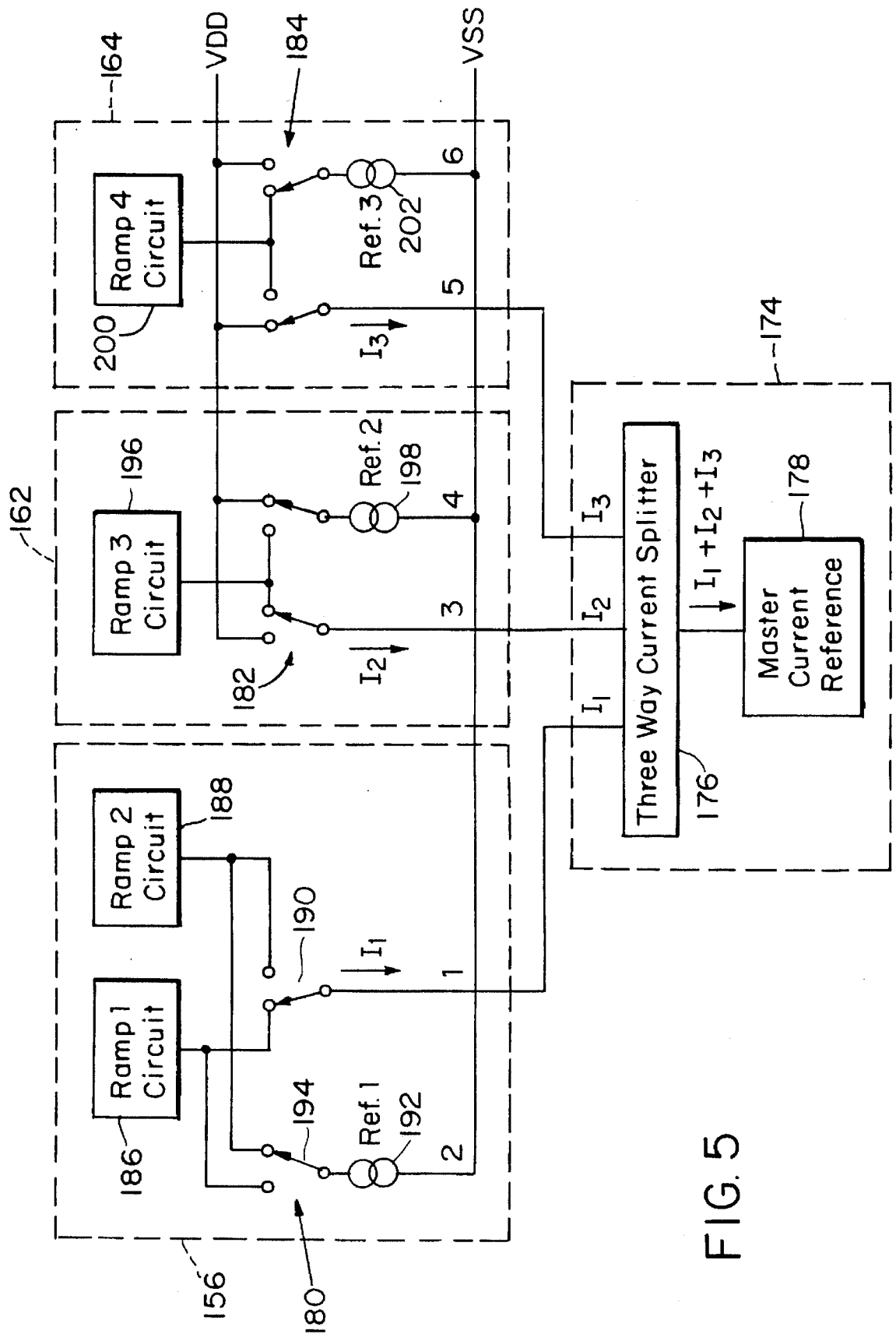
FIG. 5 is a more detailed schematic diagram of the slew rate compensator circuit of FIG. 4.

In order to reduce the number of current sources that have to be matched to provide accurate operation such as occurs when the system is operated over a wide range of frequencies, the same current source is used to provide the current for on time ramp portion 22 of ramp 16 and on time ramp portion 34 of ramp 30. Thus the same current source provides the current $I_1$ during on time 22 and provides an equal current $I_1$ during on time 34, as more fully explained hereinafter with respect to FIG. 5. While that current source is providing current $I_1$ during on time 22, a separate current source provides current $Ref_1$ to ramp 2 during off time 28. Similarly, when the current source is providing $I_1$ to ramp 2 during on time 34, the current $Ref_1$ is being provided to ramp 1 during off time 18. Since this switching naturally causes peculiarities at the transition points 110, 66, FIG. 2C, points 114, 68, FIG. 2D, similar transition peculiarities are required in ramp 3 80 and ramp 4 82 in order that they stay closely matched to ramps 1 16 and 2 30. However, the same current source cannot be used for both on time ramp portion 90 of ramp 80 and on time ramp portion 92 of ramp 82 because these ramps extend beyond the maximum usable range ΔR3, ΔR4 and overlap each other. Thus for at least a portion of the time they must both be supplied with current simultaneously, such as at time 118, FIGS. 2F and 2G. Since the currents 12 and 13 supplied during on times 90, 92 can be switched, the off time currents $Ref_2$ and $Ref_3$ are switched. Thus the current in ramp 80 during off time 88 is current $Ref_2$, and then at point 120 the current $I_2$ is provided for on time 90. Similarly, with respect to ramp 4 82, the on time current 92 ends at point 122 and the current $Ref_3$ is switched in during off time 94. This not only creates the same transition peculiarities so that ramps 3 and 4, 80 and 82, imitate ramps 1 and 2, 16 and 30; it also limits the number of current sources which must be matched over a wide current range such as caused by operation over a wide frequency range. In this particular embodiment only three such matched current sources are needed, although twelve current sources may be used in all.

If an error occurs in ramps 1 and 2, 16 and 30, respectively, FIGS. 3A and 3B, because the on time or ramp portion 22a is steeper and therefore overshoots point 66 and ramp portion 34a, FIG. 3B, is too steep and overshoots point 68, then a correction must be effected for ramps 3 and 4, 80, 82, respectively, FIGS. 3C and 3D. For ramp portion 90a, FIG. 3C, and ramp portion 92a, FIG. 3D, will also be too steep and overshoot their respective normal terminations 130, 132, thus causing the crossing point to move in to points 134 and 136.

To correct this, some of current $I_3$ and some of current $I_2$ is shifted from supplying ramp portions 90 and 92 to supply ramp portions 22 and 34. This increases the slope of ramps 22 and 34 with respect to ramps 90 and 92, so that ramps 22a and 34a will be even steeper, for example as indicated at 22b and 34b. However, when the system is recalibrated the slope portion will return to 22a and 34a while the slopes 90a and 92a will return to slopes 90 and 92. The calibration technique is explained fully in U.S. Pat. No. 5,283,515, issued Feb. 1, 1994, "Automatic Calibration System for a Ramp Voltage Generator", by Edward Perry Jordan. Without this correction pulse 100 would be foreshortened as indicated at 100a and pulse 102 would be foreshortened as shown in 102a. But by shifting the currents the full length of pulses 100 and 102 can be achieved. At times it may be desirable to intentionally increase the slope of ramp portions 22 and 34 so that the ramp portions 90 and 92 can be driven farther to the right as shown in FIGS. 3C and 3D in order to lengthen the pulses 100, 102 so that they are not just contiguous but actually overlap a bit.

An asymmetrical ramp generator system for a pulse width modulator 150, FIG. 4, using the calibration system according to this invention, includes an input clock circuit 152 which provides clock signal 10 to divide by two circuit 154 which generates clock signals 12 and 14, D1 and D2. Signals D1 and D2 are submitted to ramp generator 156 which generates ramps 1 and 2 16 and 30. Ramps R1 and R2 are provided to the positive inputs of comparators 158 and 160, respectively. The negative input of those comparators receives as a reference level X as explained with respect to FIGS. 2C and 2D. The output from comparators 158 and 160, their intermediate drive signals $DR_1$ and $DR_2$, 62 and 64, FIG. 2E, are delivered to ramp generators 162 and 164, which generate ramps R3 and R4, ramps 80 and 82, FIGS. 2F and 2G. The ramp signals 80, 82, $R_3$, $R_4$, are submitted to pulse width modulation circuits 166 and 168, such as disclosed in U.S. Pat. No. 5,295,158, "Dynamically Selectable Multimode Pulse Width Modulation System", issued Mar. 15, 1994, by Edward Perry Jordan, where they are compared with levels A', B' and C', D', respectively.

The output from pulse width modulators 166 and 168, OP1, pulse 100, and OP2, pulse 102, are or'd in OR gate 170 to produce a final sequence of pulse width modulated pulses at output 172.

Figure 6:
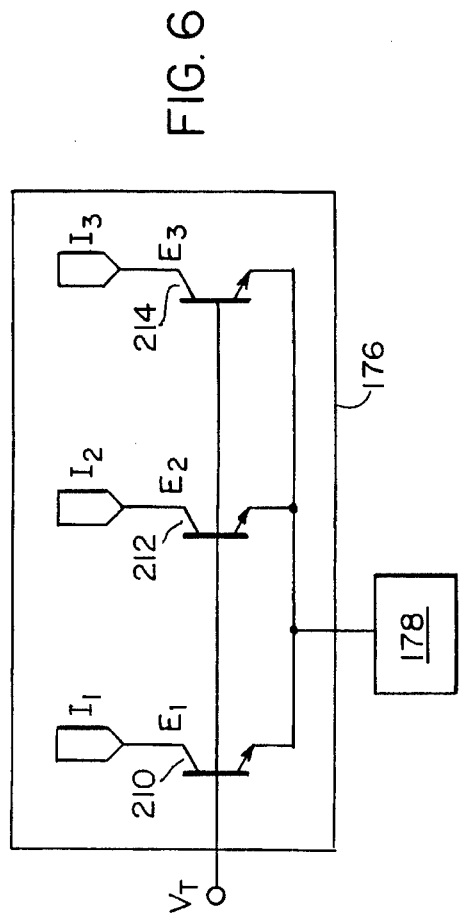
FIG. 6 is a more detailed schematic of the three-way current splitting circuit of FIG. 5.

Slew rate compensator 174 provides currents $I_1$, $I_2$ and $I_3$ to ramp 1 and ramp 2 156 and to ramp 3 generator 162 and ramp 4 generator 164. By shifting portions of current between $I_1$ and $I_2$ and $I_3$ the correction effected in FIGS. 3A–3E is accomplished. Slew rate compensator circuit 174 includes a three-way current splitting circuit 176 and a master current reference 178, FIG. 5. The switching of the current $I_1$ between on time ramp portions 22 and 34, FIGS. 2C and 2D, and the switching of the currents $I_2$, Ref$_2$ and $I_3$, Ref$_3$ explained with reference to FIGS. 2F and 2G, is accomplished by the switching mechanisms 180, 182 and 184, FIG. 5. Switching mechanism 180 is included in ramp 1 and 2 generator 156 along with ramp 1 circuit 186 and ramp 2 circuit 188. In one position of the switches, as shown, $I_1$ is supplied to the ramp 1 circuit 186 through switch 190, and Ref$_1$ current from source 192 is supplied to ramp 2 circuit 188 through switch 194. In the other position switch 190 provides $I_1$ to ramp 2 circuit 188 and switch 194 provides Ref 1 current to ramp 1 circuit 186. Switching circuit 182 included with ramp 3 circuit 196 in ramp 3 generator 162 provides current $I_2$ to ramp 3 circuit 196 in one position, and in the other position provides Ref$_2$ current from source 198 to ramp 3 circuit 196. Switch 184 included in ramp 4 generator 164 along with ramp 4 circuit 200 provides current Ref 3 from source 202 to ramp 4 circuit 200 and in the other position provides current $I_3$ to ramp 4 circuit 200. The sharing of the current as explained with reference to FIGS. 3A–3E is accomplished by three-way current splitting circuit 176 as shown in more detail in FIG. 6, where it is illustrated as including three transistors 210, 212 and 214 having emitter areas $E_1$, $E_2$ and $E_2$. The emitter areas of transistors 212 and 214 are equal. The size of the emitter area $E_1$ relative to the size of the areas $E_2$ may be greater, equal or less, depending upon whether it is desired to correct an overshoot, ideal conditions exist, or it is desired to increase or decrease the slope of the ramp portions 90 and 92 of ramps 3 and 4. The implementation in FIGS. 6 is but one of a number of approaches which can be used. For example, resistor degeneration could be used by inserting resistors in the emitter circuits of each of the transistors 210, 212 and 214. The resistors could be trimmed, ratios could be changed, FETs could be used in place of bipolars, for example.

Figure 7:
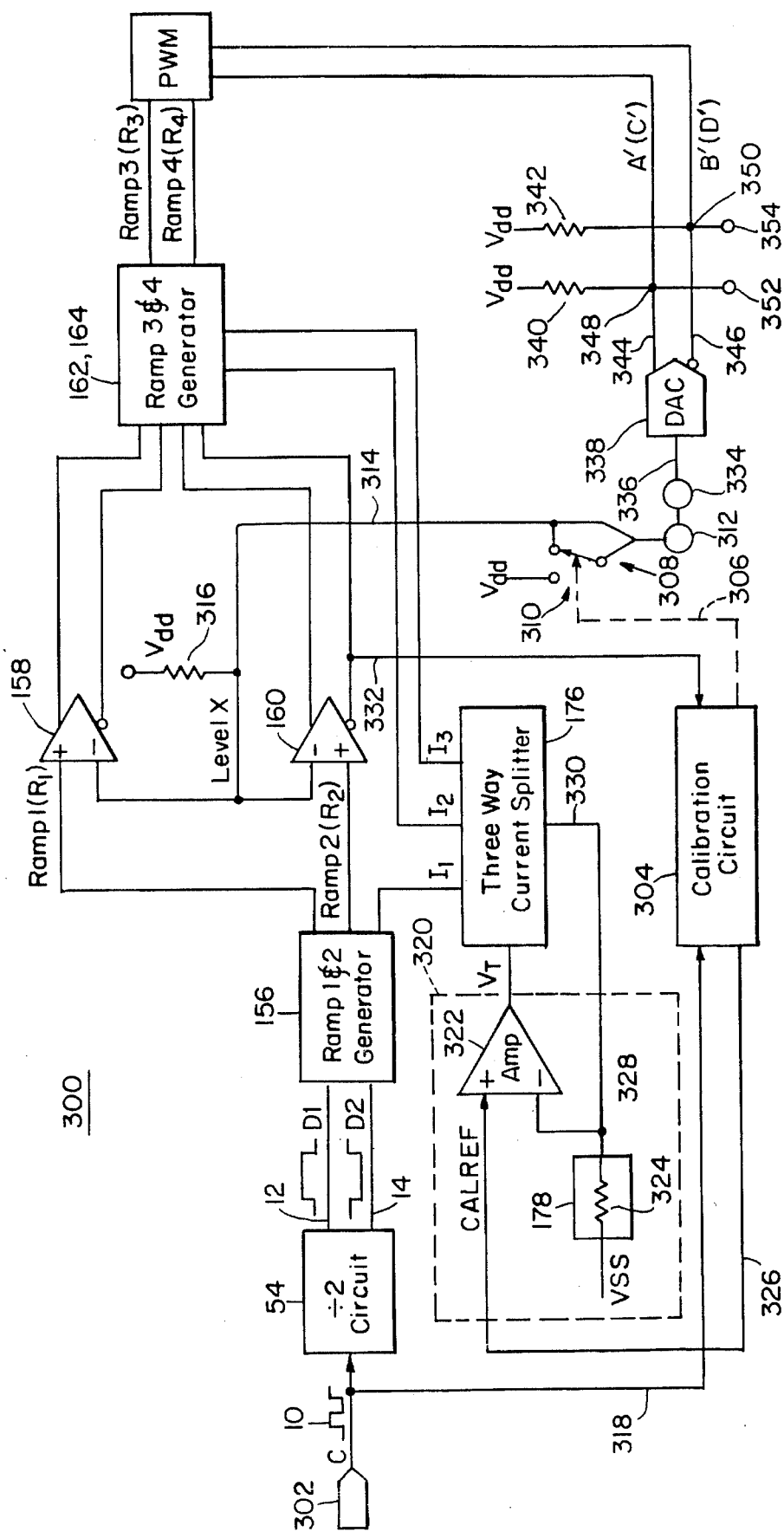
FIG. 7 is a detailed schematic of an asymmetrical ramp generator system and calibration system according to this invention.

There is shown in FIG. 7 a calibration system 300 according to this invention for an asymmetrical ramp generator system for a pulse width modulator. The input clock signal 10 provided at terminal 302 is delivered to divide by two circuit 154 which provides divide by two clock outputs 12 D1 and 14 D2 to a ramp 1 and 2 generator 156. The ramp 1 output $R_1$ is provided to positive input comparator 158 while the ramp 2 output $R_2$ is delivered to positive input comparator 160. The reference level X is provided to the negative input of each of comparators 158 and 160. When calibration circuit 304 is set to the calibration mode it delivers a signal on line 306 to current splitting circuit 308 which includes switch 310. Switch 310 provides a current flow from current source 312 over line 314 to resistor 316 which establishes the voltage known as level X. The other end of resistor 316 is connected to supply voltage $V_{DD}$. Normally switch 310 is closed to provide one portion of the current from current source 312 to $V_{DD}$ and the second portion over line 314 to resistor 316 to establish the voltage level known as level X. The other end of resistor 316 is connected to supply voltage $V_{DD}$. In the calibration mode, switch 310 is thrown to the position as shown in FIG. 7 so that all of the current from current source 312 is delivered over line 314 to resistor 316. This pulls the voltage of level X all the way down to the lower limit of the voltage range, level 66, FIG. 2C, level 68, FIG. 2D. The distance that ramp 1 or ramp 2 travels is the same as the distance $\Delta R_3$ or $\Delta R_4$, FIGS. 2F, 2G, the maximum usable range. A typical current split would be that one fifth or 20% of the current is supplied to resistor 316 and in the calibration mode the additional four fifths, or the entire current supplied by current source 312, is supplied to resistor 316. The calibration circuit then clocked by the input clock signal 10 over line 318 drives current stepping device 320 which includes amplifier 322 and master current reference 178 which may be implemented by resistor 324. As calibration circuit 304 increases the calibration reference signal on line 326 to the positive input of amplifier 322, the negative input and thus point 328 is also raised so that the current on line 330 to the $I_{Ref}$ input of three-way current splitting circuit 176 is increased. This increases each of the current outputs $I_1$, $I_2$ and $I_3$ so that the slew rate or slopes of each of the ramps is increased or steepened. When the steepness of at least one of ramp 1 or ramp 2, for example the one monitored by comparator 160, reaches the lower limit of the voltage range, the signal on line 332 goes high, setting a latch in the calibration circuit which ends the calibration mode of operation. At this time switch 310 is switched to $V_{DD}$ so that level X is raised to the level shown in FIGS. 2C and 2D. In order to enable the single calibration operation to calibrate both ramp 1 and 2 generator 156 and the ramp 3 and 4 generators 162 and 164 must be closely matched to the ramps generated by ramp 1 and 2 generator 156 which is, as explained with reference to FIGS. 2A–H and the operation of three-way current splitting circuit 176 in FIGS. 5 and 6, accomplished by the current switching means in FIG. 5 and the three-way current splitting circuit in FIGS. 5 and 6. In addition, the current source 312 is slaved to a second current source 334 which provides an identical current to produce the upper and lower limits A', B' for the third ramp or C', D' for the fourth ramp.

In this specific embodiment the current is provided on line 336, for example a DAC 338. Two DAC output lines 344, 346 are connected to supply voltage $V_{DD}$ through resistors 340 and 342. In one state no current flows in line 344 and all the current from source 334 flows in line 346. In that condition, voltage level $\Delta R_3$ or $\Delta R_4$ matches the distance that voltage level X is below levels 18 and 28 during the calibration procedure. When the current flow is interchanged between lines 344 and 346 then the voltage level A' is brought to voltage level B'. A similar arrangement can be used to drive voltage levels C' and D'. It is always the case that when all the current flows in one of lines 344 or 346 the current flow through the associated resistor 340 or 342 causes a large drop which results in voltage level $V_{DD}-\Delta R_3$ or $V_{DD}-\Delta R_4$ at terminals 348 or 350. A predetermined range between voltage levels A' and B' and between voltage levels C' and D' is always the maximum usable range of the system indicated as $\Delta R1$ or $\Delta R2$ in FIGS. 2C and 2D. However, additional current sources 352 and 354 may be added at terminals 348 and 350 in order to shift voltage levels A', B' and voltage levels C', D' without changing the extent of the range merely to be sure that the upper limits of voltage levels A' and C' are sufficiently below the off-time portion of ramps 3 and 4, FIGS. 2F and 2G, so that there is sufficient voltage for the comparators to operate.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A calibration system for an asymmetrical ramp generator system for a pulse width modulator, comprising:

a complementary clock circuit;

a first symmetrical dual ramp generator, responsive to said clock circuit, for generating first and second ramps having a predetermined voltage range and extending for a period equal to or greater than one half the clock cycle;

a comparator device, responsive to each of said first and second symmetrical ramps and to a reference level within the said predetermined voltage range of said first and second ramps, for generating corresponding dual first and second asymmetrical drive signals;

a second asymmetrical dual ramp generator, responsive to said first and second asymmetrical drive signals, for generating third and fourth asymmetrical overlapping ramps which extend beyond said predetermined voltage range;

a calibration circuit;

a first current splitting circuit, responsive to said calibration circuit, for establishing said reference level at the lower limit of said predetermined voltage range;

a second current splitting circuit for providing slew rate currents to the first and second ramp generators for controlling the slew rate of said first, second, third and fourth ramps;

a current stepping device, responsive to said calibration circuit, for varying the current to said second current splitting circuit, for varying the slew rate of said first, second, third and fourth ramps;

said calibration circuit including means, responsive to at least one of said first and second ramps reaching the lower limit, for fixing the current provided by said current stepping device to said first and second ramps and simultaneously calibrating said third and fourth ramps and stopping the calibration, said reference level being returned to within said predetermined voltage range after calibration.

2. The calibration system for an asymmetrical ramp generator system of claim 1 in which said first current splitting circuit includes a first current source matched to a second current source which sets the upper and lower limits of said predetermined voltage range.

3. The calibration system for an asymmetrical ramp generator system of claim 1 in which said first symmetrical dual ramp generator includes first and second ramp generators, a first current source for supplying a first current to set the slew rate of the active one of said first and second ramps and a second current source for supplying a second current to set the upper level of the inactive one of said first and second ramps and first switching means for alternately, selectively, interchanging said first and second current sources between said first and second ramp generators.

4. The calibration system for an asymmetrical ramp generator system of claim 3 in which said second asymmetrical dual ramp generator includes third and fourth ramp generators, a third current source for supplying a third current to set the slew rate of said third ramp, a fourth current source for supplying a fourth current to set the upper level of said third ramp, a fifth current source for supplying a fifth current to set the slew rate of said fourth ramp, a sixth current source for supplying a sixth current to set the upper level of said fourth ramp, and second switching means for alternately, selectively, connecting said third and sixth current sources to one of said third and fourth ramp generators and said fourth and fifth current sources to other of said third and fourth ramp generators.

\* \* \* \* \*